United States Patent
Yu et al.

(10) Patent No.: US 10,019,029 B1
(45) Date of Patent: Jul. 10, 2018

(54) MULTI-LAYER INJECTION MOLDED DEVICE HOUSINGS

(71) Applicant: Amazon Technologies, Inc., Seattle, WA (US)

(72) Inventors: Michael Xingyi Yu, Mountain View, CA (US); Brandon Michael Potens, Campbell, CA (US); Kelly Erin Johnson, Menlo Park, CA (US); Mark Novak, Santa Clara, CA (US); Ge PengJin, Shenzhen (CN); Robert Cong Liang, Dublin, CA (US); Angel Wilfredo Martinez, Aptos, CA (US); Srivatsan Subbarayan, Sunnyvale, CA (US); Mandar Nilkanth Kulkarni, Sunnyvale, CA (US); Marc Anthony Zampino, San Jose, CA (US); Felipe Alonso Varela, San Jose, CA (US); Michael Christopher Kouxommone, Mountain View, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 245 days.

(21) Appl. No.: 14/791,708

(22) Filed: Jul. 6, 2015

(51) Int. Cl.
| | |
|---|---|
| *G06F 1/16* | (2006.01) |
| *G02F 1/1333* | (2006.01) |
| *B29C 67/00* | (2017.01) |
| *H05K 7/14* | (2006.01) |
| *B29C 45/14* | (2006.01) |

(Continued)

(52) U.S. Cl.
CPC ...... *G06F 1/1601* (2013.01); *B29C 45/14336* (2013.01); *B29C 45/1671* (2013.01); *G06F 1/1637* (2013.01); *G06F 1/183* (2013.01); *H05K 5/0017* (2013.01); *H05K 5/03* (2013.01); *H05K 7/1417* (2013.01); *B29K 2069/00* (2013.01);

(Continued)

(58) Field of Classification Search
CPC .... G06F 1/1601; G06F 1/1637; G06F 1/1626; G06F 1/1658; G06F 1/183; G06F 1/188; H05K 7/1417; H05K 5/0017; H05K 5/03; B29C 45/14336; B29C 45/1671
USPC ................. 361/679.24; 349/58–60; 264/46.7
See application file for complete search history.

(56) References Cited

U.S. PATENT DOCUMENTS

| | | | |
|---|---|---|---|
| 6,897,815 B2 * | 5/2005 | Goto ...................... | H01Q 1/243 343/702 |
| 8,442,593 B1 * | 5/2013 | Kwon ................. | H04M 1/0266 455/556.1 |

(Continued)

OTHER PUBLICATIONS

Naitove, "Injection Molding at K 2013: Doing More with Less", PT Plastics Technology, Available at: http://www.ptonline.com/articles/injectionmoldingatk2013doingmorewithless, 9 pages, (Jan. 2014) (printed Jul. 6, 2015).

*Primary Examiner* — Nidhi Thaker
(74) *Attorney, Agent, or Firm* — K&L Gates LLP

(57) ABSTRACT

A housing for an electronic device includes a single rear housing assembly coupled to the cover glass of a display assembly. The rear housing assembly includes a metal rear chassis with two layers of injection molded material formed on at least the chassis side regions. The first injection molded layer includes a high reinforcing agent content percentage to provide increased stiffness, and the second injection molded layer includes a low reinforcing agent content percentage, which provides less structural support than the first injection molded layer, but an improved aesthetic appearance.

19 Claims, 10 Drawing Sheets

(51) Int. Cl.
*B29C 45/16* (2006.01)
*H05K 5/00* (2006.01)
*H05K 5/03* (2006.01)
*G06F 1/18* (2006.01)
*B29K 69/00* (2006.01)
*B29K 705/00* (2006.01)
*B29L 31/34* (2006.01)

(52) U.S. Cl.
CPC ... *B29K 2705/00* (2013.01); *B29L 2031/3481* (2013.01)

(56) References Cited

U.S. PATENT DOCUMENTS

| | | | |
|---|---|---|---|
| 8,506,327 B2 | 8/2013 | Jol | |
| 8,557,158 B2 | 10/2013 | Shen et al. | |
| 8,861,198 B1* | 10/2014 | Asuncion | G06F 1/1658 361/679.3 |
| 9,616,625 B2* | 4/2017 | Allore | B29D 11/00009 |
| 2009/0067112 A1* | 3/2009 | Takabayashi | G02F 1/13452 361/220 |
| 2009/0185340 A1* | 7/2009 | Ji | B29C 45/14786 361/679.21 |
| 2010/0230155 A1* | 9/2010 | Hashizume | B29C 45/14639 174/521 |
| 2012/0157175 A1 | 6/2012 | Golko et al. | |
| 2013/0147330 A1* | 6/2013 | DiFonzo | G06F 1/1656 312/297 |
| 2014/0055962 A1* | 2/2014 | Kim | H05K 5/0086 361/748 |
| 2014/0370946 A1 | 12/2014 | Daniell et al. | |
| 2015/0194833 A1* | 7/2015 | Fathollahi | H02J 7/0044 320/114 |
| 2015/0261033 A1* | 9/2015 | Shin | H05K 5/0086 349/58 |

* cited by examiner

MULTI-LAYER INJECTION MOLDED DEVICE HOUSINGS

BACKGROUND

Popular electronic devices include tablet computers, electronic book readers, and smartphones. Such electronic devices typically include a housing assembly coupled to the cover glass of a display assembly. In a commonly used housing assembly design, three separate mechanical chassis parts—a mid-frame, a rear cover, and a front cover—are joined to form the housing assembly. Most of the electronic components within the device, including the main printed circuit board (PCB) and the liquid crystal display (LCD) module, are attached to the mid-frame with screws. Next, the touch-sensing panel is attached to the front cover, and then the mid-frame with electronic components already mounted on it is attached to the front cover with additional screws. Finally, the rear cover is attached to the front cover to enclose all of the components. The mid-frame must have a fairly high structural rigidity in order to support all of the components which are attached to it before the mid-frame is attached to the front and rear covers. This typically requires that the mid-frame be formed out of a relatively thick metal frame, thereby increasing size and weight. This design is advantageous because the rear cover can be removed to easily access the various components for re-working or repair, but the use of three parts to form a housing assembly increases the overall parts count and may, therefore, increase manufacturing costs.

In many devices currently on the market, the housing assembly includes injection molded plastics formed onto metal chassis components. These plastic moldings can provide increased stiffness to the housing and may also provide an improved external appearance of the device by covering less aesthetically pleasing structures, such as a bare metal chassis. However, thick layers of plastic molding material increase the weight and thickness of the device.

Device manufacturers are constantly searching for ways to reduce manufacturing cost, decrease the size and weight of the mechanical chassis components, and improve the aesthetic appearance of the device. Accordingly, there is a need for improved housing architectures for electronic devices.

DETAILED DESCRIPTION

Figure 1B:
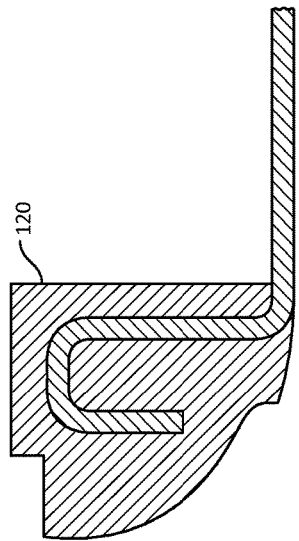
FIGS. 1A-1D illustrate cross-sectional views of a method of forming a two-layer injection molded rear housing assembly, in accordance with embodiments of the present invention.

In the following description, reference is made to the accompanying drawings, which illustrate several embodiments of the present disclosure. It is to be understood that other embodiments may be utilized and system or process changes may be made without departing from the spirit and scope of the present disclosure. The following detailed description is not to be taken in a limiting sense, and the scope of the embodiments of the present invention is defined only by the claims of the issued patent. It is to be understood that drawings are not necessarily drawn to scale.

In accordance with embodiments of the present invention, the housing for an electronic device, such as a smartphone, tablet, or e-book reading device, includes a single rear housing assembly coupled to the cover glass of a display assembly. The rear housing assembly includes a metal rear chassis with two layers of injection molded material formed on at least the chassis side regions. The first injection molded layer is formed on the sides of the rear chassis and includes a high glass fiber content percentage to provide increased stiffness. The second injection molded layer is formed on the chassis side regions at least partially overlaying the first injection molded layer, such that when the rear housing assembly is coupled to the cover glass of the display assembly, the first injection molded layer is not visible on the exterior of the device. The second injection molded layer includes a low glass fiber content, which provides less structural support than the first injection molded layer, but an improved aesthetic appearance.

In accordance with some embodiments of the present invention, the single rear housing assembly further comprises a mounting assembly attached to the metal rear chassis. The mounting assembly comprises a thin metal sheet with a plurality of screw bosses attached thereto. Various components of the electronic device, such as a PCB, are then attached to the mounting assembly via screws received in the screw bosses. After the components are attached to the mounting assembly, the display assembly is coupled to the rear housing assembly.

In accordance with some embodiments of the present invention, a housing assembly comprises a chassis structure having two injection molded layers deposited thereon. The first mold layer comprises a base resin with a first type of reinforcing agent content, such as, for example, continuous-strand fiber filaments. The first mold layer provides a high level of structural stiffness and is applied to select regions of the chassis structure where a greater degree of structural reinforcement is needed, such as, for example, the corners of the chassis structure. The second mold layer comprises a base resin with a different type of reinforcing agent content, such as, for example, chopped-strand fiber filaments. The second mold layer provides a lower level of structural stiffness to the housing assembly, but is more versatile in that it can be formed on more complex geometries than a mold layer with continuous-strand fiber filaments. Therefore, the two mold layers can be selectively deposited to provide high levels of stiffness or high deposition versatility, depending on the desired properties for that localized region of the chassis.

FIGS. 1A-1D illustrate cross-sectional views of a method of forming a two-layer injection molded rear housing assembly, in accordance with embodiments of the present invention. FIGS. 2A-2D illustrate perspective views of the method of forming a two-layer injection molded rear housing assembly, in accordance with embodiments of the present invention. FIG. 3 illustrates a method 300 of forming a two-layer injection molded rear housing assembly, in accordance with embodiments of the present invention.

Figure 1D:
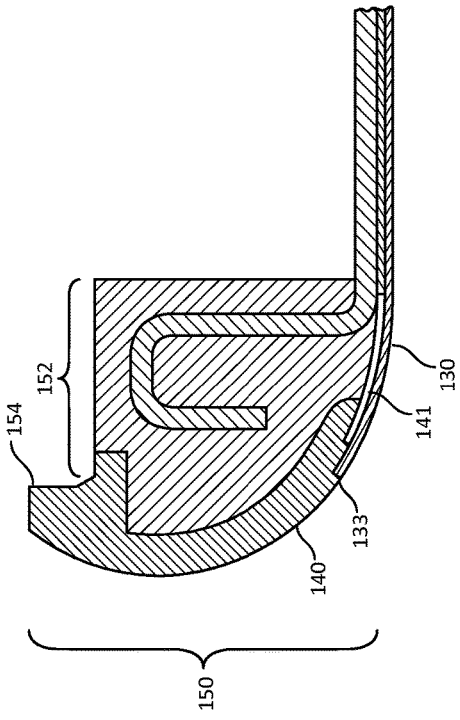
Figure 1A:
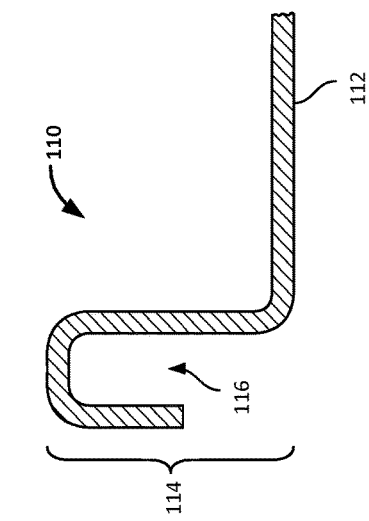
Figure 2A:
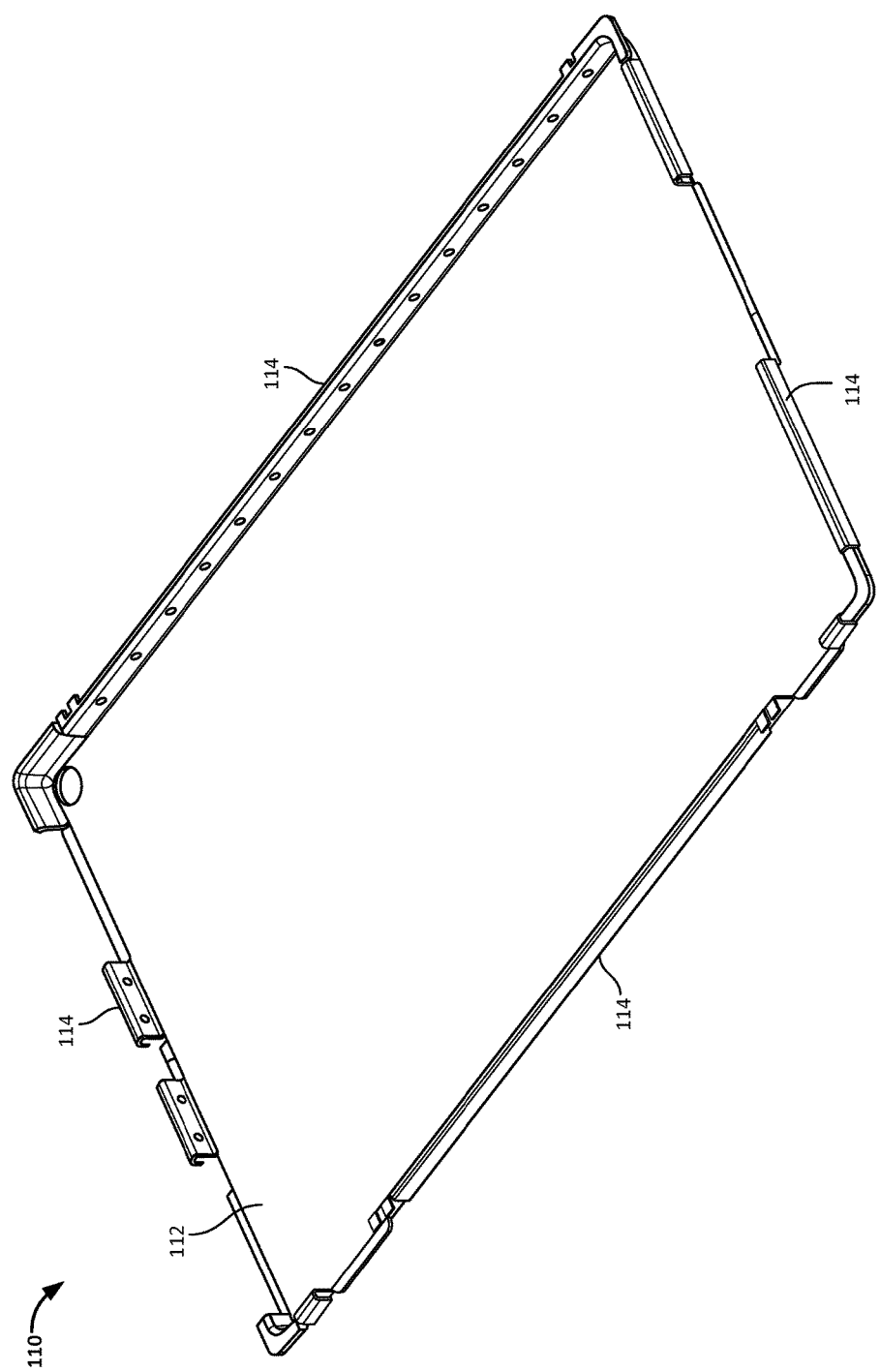
FIGS. 2A-2D illustrate perspective views of the method of forming a two-layer injection molded rear housing assembly, in accordance with embodiments of the present invention.
Figure 3:
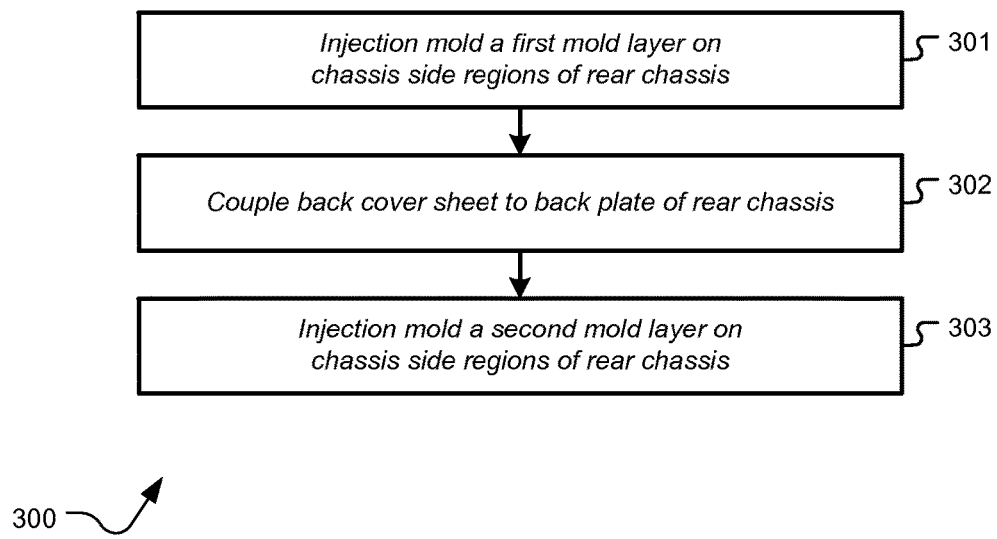
FIG. 3 is a flowchart of a method of forming a two layer injection molded rear housing assembly, in accordance with embodiments of the present invention.

FIG. 1A is a cross-sectional view of a portion of a rear chassis 110, and FIG. 2A is a perspective view of rear chassis 110. In this embodiment, the rear chassis 110 comprises a sheet of aluminum having a thickness of approximately 0.5 mm and includes a back plate 112 and four chassis side regions 114. The rear chassis may be formed out of any of a variety of materials, such as, e.g., a stamped metal, such as steel or aluminum.

Figure 2B:
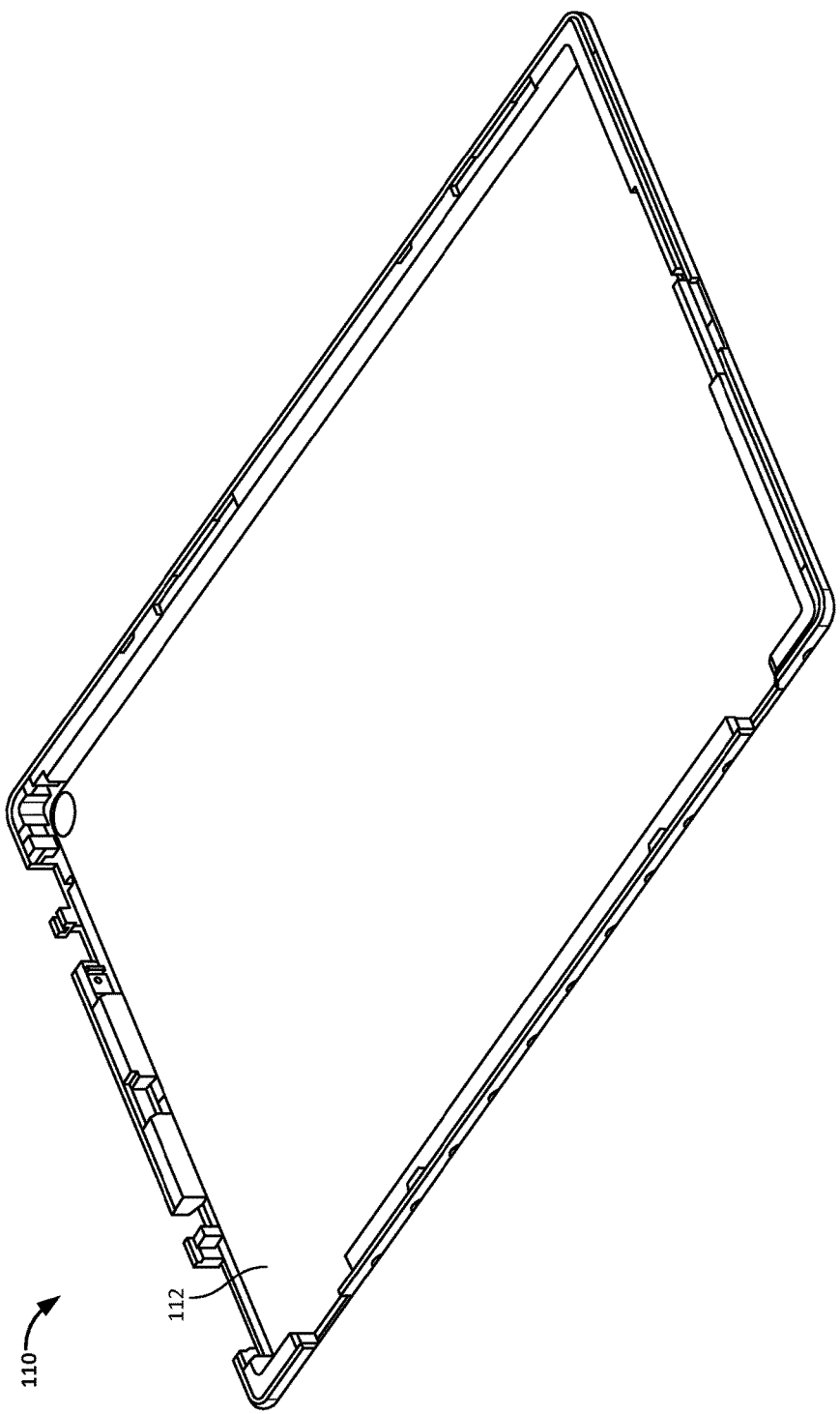

In step 301 in FIG. 3, a first mold layer 120 is injection molded onto the chassis side regions 114 of rear chassis 110. FIGS. 1B and 2B illustrate cross-sectional and top perspective views, respectively, of rear chassis 110 after the first mold layer 120 is formed on the rear chassis 110.

Figure 1C:
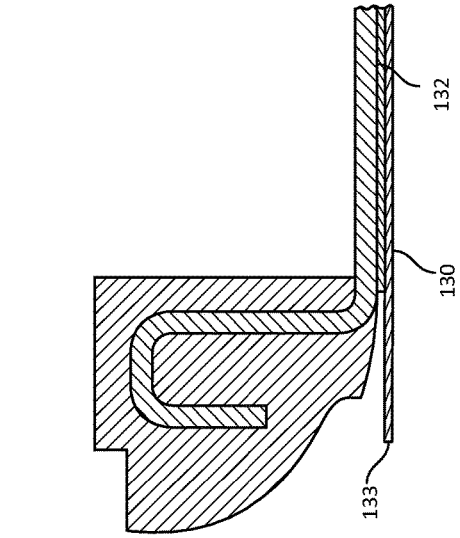
Figure 2C:
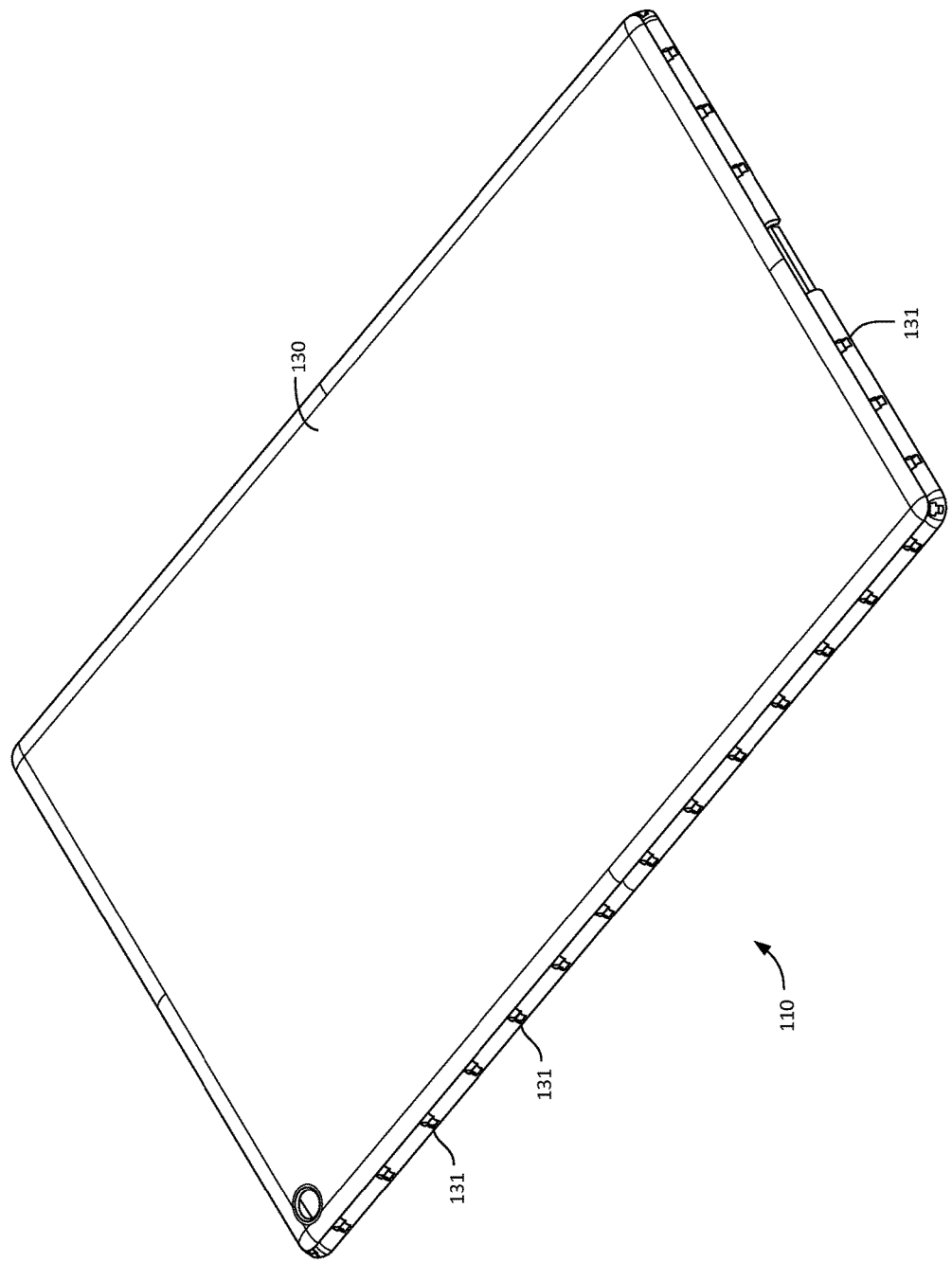

In step 302 in FIG. 3, a decorative back cover sheet 130 is adhered to the back plate 112 of rear chassis 110. FIGS. 1C and 2C illustrate cross-sectional and bottom perspective views, respectively, of rear chassis 110 after the back cover sheet 130 is coupled to the back plate 112.

As shown in FIG. 1C, the back cover sheet 130 may be coupled to the exterior side of the rear chassis 110 with an adhesive layer 132. In some embodiments, this adhesive layer 132 may not extend completely to the edge of the back cover sheet 130, thereby permitting the edge 133 of the back cover sheet 130 to extend away from first mold layer 120. The edge 133 of the back cover sheet 130 will be fully adhered to the underlying second mold layer 140, as will be described in greater detail below.

As shown in FIG. 2C, the first mold layer 120 may be formed to define a plurality of interlock features 131. These interlock features 131 may comprise a dovetail sockets, which can help to establish a mechanical interlock between the first mold layer 120 and the second mold layer 140 deposited onto the first mold layer 120.

Figure 2D:
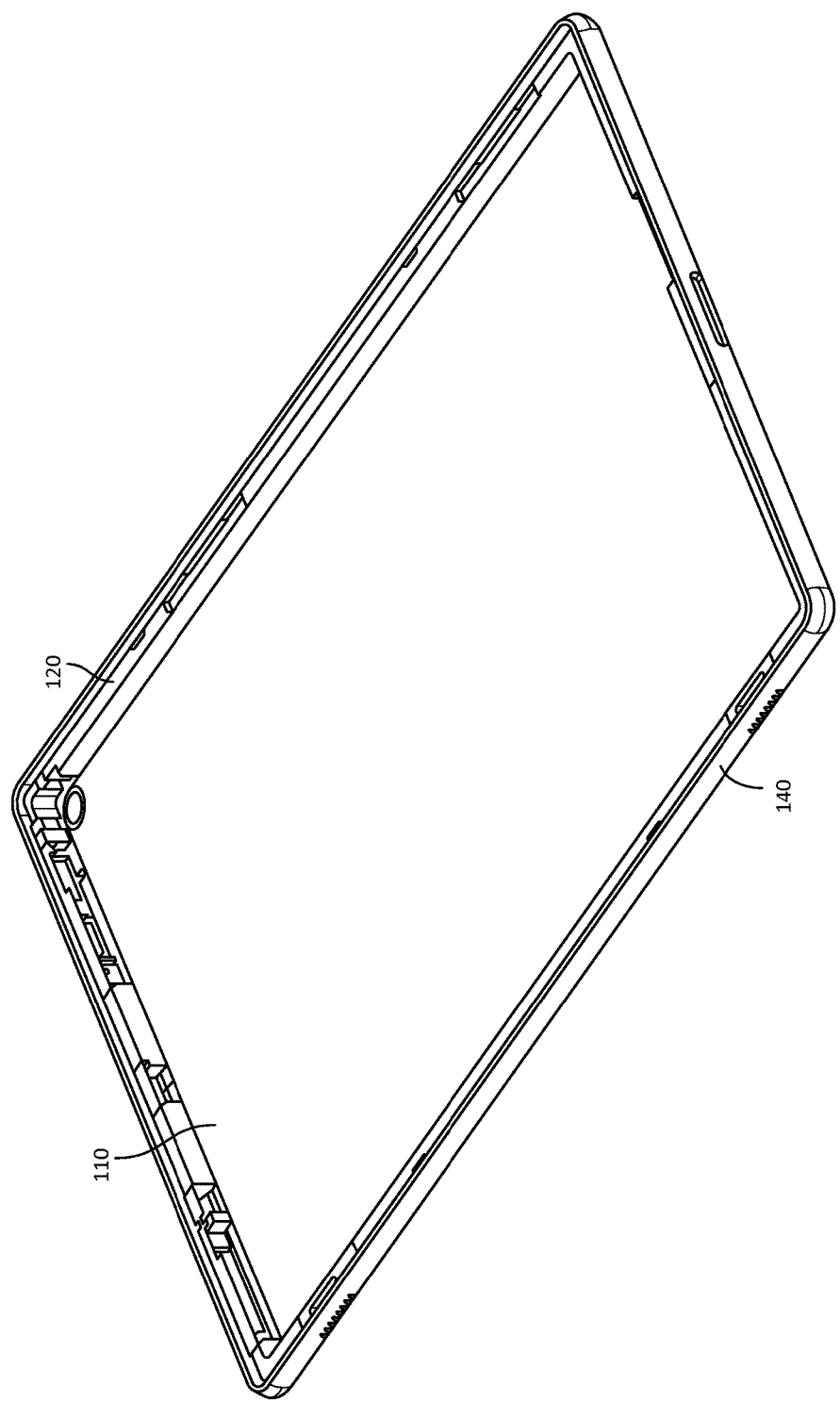

In step 303 in FIG. 3, a second mold layer 140 is injection molded onto the chassis side regions 114 of rear chassis 110. FIGS. 1D and 2D illustrate cross-sectional and top perspective views, respectively, of rear chassis 110 after the second mold layer 130 is molded onto the rear chassis 110 to form four sidewall portions 150.

As shown in FIG. 1D, portions of the first mold layer 120 and the second mold layer 140 form a flat ledge portion 152 on an upper side of the rear housing assembly, and a portion of the second mold layer 140 forms a rim portion 154. As will be described in greater detail below, the display assembly is positioned on and adhered to the ledge portion 152.

As further shown in FIG. 1D, the second mold layer 140 is overmolded onto portions of the first mold layer 120, and the back cover sheet 130 overlaps other portions of the first mold layer 120. As a result, when the display assembly is coupled to the rear housing assembly to complete the final assembly of the electronic device, the first mold layer 120 is not visible on the exterior of the device, and a user will see only the second mold layer 140 and back cover sheet 130. When the partially completed rear housing assembly 400 is positioned in the mold tool to form the second mold layer 140, the edge 133 of the back cover sheet 130 is curved by the inner surface of the mold tool so as to form a flush transition with the second mold 140. The inner surface of the edge 133 of the back cover sheet 130 is adhered to the second mold layer 140 when the second mold layer 140 is formed, thereby retaining the back cover sheet 130 in the desired curved shape shown in FIG. 1D. This provides the device with an aesthetically pleasing appearance and desirably smooth surface for handling. In some embodiments, a small gap 141 may be formed between the inner surface of the back cover sheet 130 and the underlying first mold layer 120 and second mold layer 140. In other embodiments, the gap 141 may be filled by the first mold layer 120 and second mold layer 140.

Figure 4:
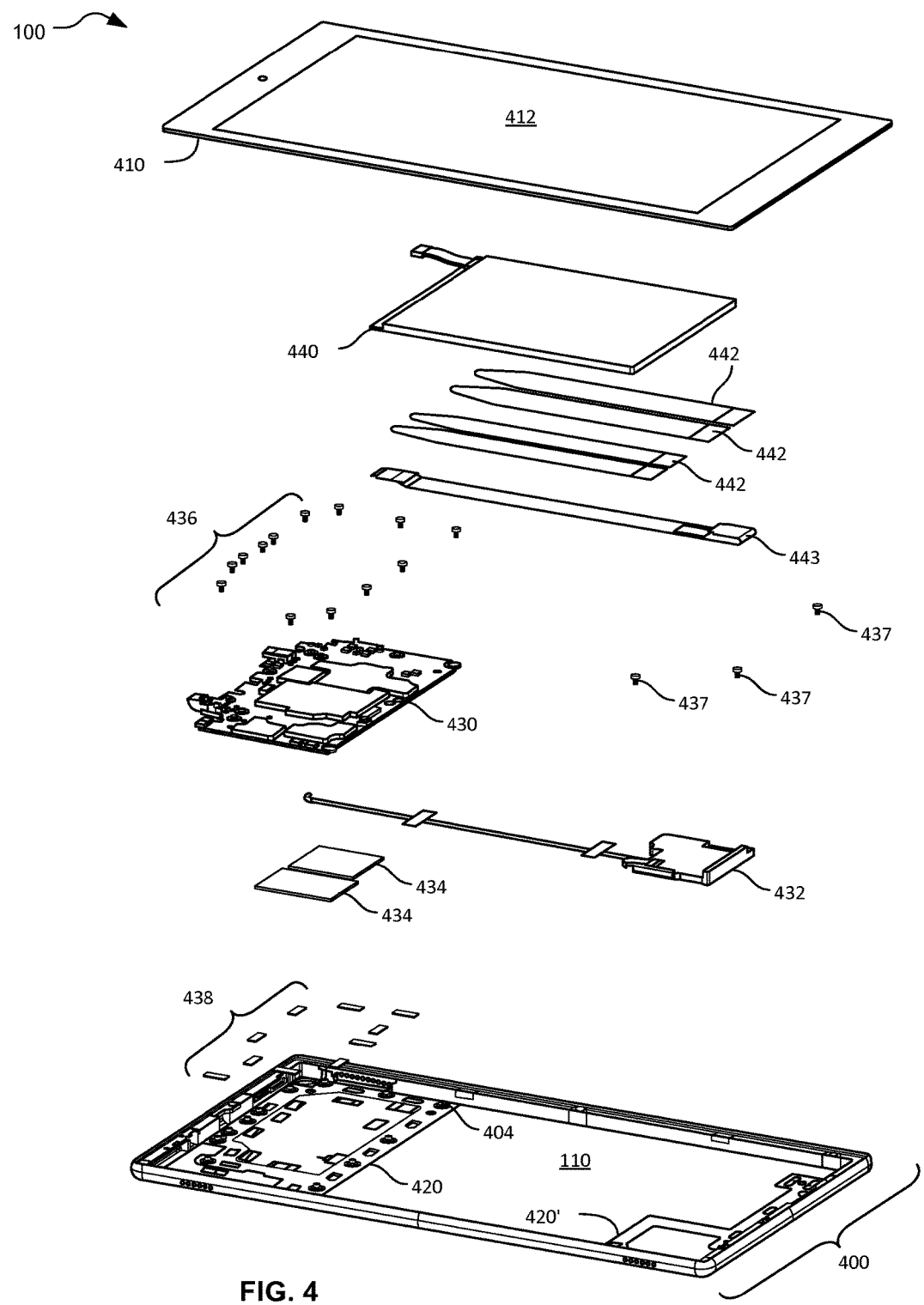
FIG. 4 is an exploded perspective view of an electronic device, in accordance with embodiments of the present invention.

FIG. 4 is an exploded perspective view of an electronic device 100, in accordance with embodiments of the present invention. The housing of the device 100 comprises a rear housing assembly 400 coupled with a display assembly 410.

Figure 5:
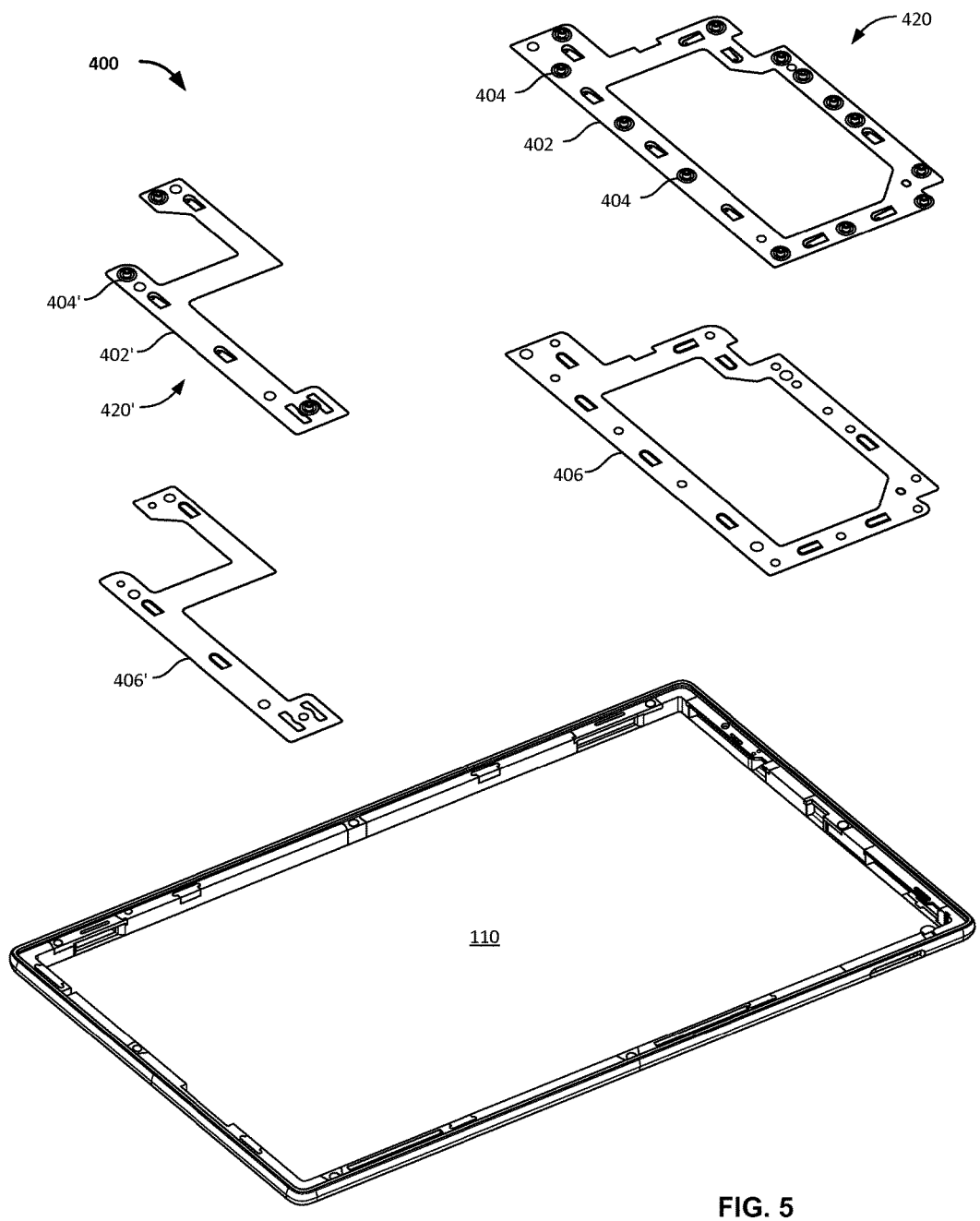
FIG. 5 is an exploded perspective view of a rear housing assembly, in accordance with embodiments of the present invention.

FIG. 5 is an exploded perspective view of rear housing assembly 400. The rear housing assembly 400 comprises a mounting assembly 420 and the rear chassis 110 with the first mold layer 120, the second mold layer 140, and back cover sheet 130 formed thereon.

In accordance with embodiments of the present invention, the mounting assembly 420 is used to provide a structure to which various components of the device may be attached. In contrast with a traditional mid-frame architecture in which the components are attached with screws to the mid-frame before the mid-frame is attached to the rear cover and front cover, the mounting assembly 420 is attached to the rear chassis 110 before the components are attached. The mounting assembly 420 may be coupled to the rear chassis 110 using any suitable bonding method. In the illustrated embodiment, a pressure sensitive adhesive layer 406 is used to adhere the mounting assembly 420 to the back plate 112 of the rear chassis 110. In other embodiments, the mounting assembly 420 may be welded to the rear chassis 110, adhered using a liquid adhesive, and/or mechanically attached using flanges and/or fasteners. The metal mounting assembly 420 may further provide a ground path for the components mounted thereon.

A traditional mid-frame must have enough structural strength to support the various components attached to it during the subsequent handling steps. In contrast, the rear chassis 110 provides the mounting assembly 420 with additional stiffness and structural support for supporting the various components of the device 100. As a result, the mounting assembly 420 may be formed out of a significantly thinner and weaker structure than a traditional mid-frame, and may alone provide very little structural rigidity. In the illustrated embodiment, the mounting assembly 420 comprises a stainless steel plate member 402 having a thickness of approximately 0.16 mm, and a plurality of stainless steel screw bosses 404. In other embodiments, the plate member 402 may have a thickness of less than approximately 0.5 mm, less than approximately 0.25 mm, or less than approximately 0.1 mm. In each of those embodiments, the rear chassis 110 provides the plate member 402 with structural support to enable the assembly to be handled and components to be attached.

Each of the screw bosses 404 includes a threaded hole into which fasteners, such as screws 436, may be attached. The screw bosses 404 may be attached to the plate member 402 using any desired bonding method, such as, for example, welding or laser welding. When using laser welding, it may be necessary for the screw bosses 404 to be made of the same material as the plate member 402. Screw bosses 404 formed out of stainless steel may provide a more desirable fastening ability than other materials. When the plate member 402 is made of stainless steel and the rear chassis 110 is made of a different metal, such as aluminum, it may not be possible to weld the plate member 402 to the rear chassis 110. Therefore, an adhesive, such as a pressure sensitive adhesive may be used to adhere the dissimilar metals together. In other embodiments, the mounting assembly 420 may be formed of different materials, shapes, and sizes. For example, the plate member 402 and screw bosses 404 may be made of aluminum instead of stainless steel. In addition, in some embodiments, the plate member 402 and screw bosses 404 may be formed as a single component instead of two components laser welded together.

In some embodiments, the rear housing assembly 400 may include multiple mounting assemblies. As shown in FIG. 5, a second mounting assembly 420' is attached to a lower portion of the rear chassis 110 using a pressure sensitive adhesive layer 406'. The second mounting assembly 420' may comprise a metal plate member 402' made of the same material as plate member 402, but in a different shape and/or with a different arrangement of screw bosses 404' so as to accommodate the mounting of different components to the rear housing assembly 400. In some embodiments, the underlying metal chassis structure can be omitted, and the housing can be formed entirely out of different regions of injection molded material.

Returning to FIG. 4, the rear housing assembly 400 is shown with the mounting assemblies 420, 420' attached to the rear chassis 110. The device 100 includes a main PCB board 430 with various electronic components provided thereon, including, for example, microprocessors, microcontrollers, communications logic, audio logic, and video logic. The main board 430 is positioned over the mounting assembly 420 and is attached to the mounting assembly 420 using screws 436 threaded into the screw bosses 404. Similarly, speaker component 432 is attached to mounting assembly 420' using screws 437. A plurality of conductive foam grounding pads 438 may be adhered between the main board 430 and the rear chassis 110 to provide an additional ground path for the main board 430. Because the mounting assembly 420 is positioned between the main board 430 and the interior surface of the rear chassis 110, a gap will be formed between portions of the main board 430 and the interior surface of the rear chassis 110. Foam vibration dampening pads 434 may also be positioned between the main board 430 and the rear chassis 110 to provide cushioning and dampening of vibrations that might result due to the gap.

In the illustrated embodiment, the device 100 includes a battery module 440. The battery module 440 may comprise a package containing one or more battery cells and a battery PCB to operatively couple the battery cells together. The battery module 440 may be attached to the rear chassis 110 using any suitable means, such as, for example, glue or solder. In some embodiments, the battery module 440 may be adhered to rear chassis 110 with stretch releasing double-sided adhesive strips 442, providing a strong and significant bond that prevents the battery module 440 from decoupling due to a drop of the electronic device 100. Despite the strong bond, the battery module is removable and replaceable because the stretch releasing double-sided adhesive strips 442 may be stretched in order to separate the battery module 440 from the chassis 110. Accordingly, the battery module does not need to be glued or soldered to the housing 104, and the problem of damaging the housing 104 or the battery module 440 during removal of the glued or soldered battery module 440 for repair or reworking may avoided. Examples of a stretch releasing double-sided adhesive strip 442 are Tesa 70425 from Biersdorf AG and VHB 5906 from the Minnesota Mining and Manufacturing Company.

Figure 6:
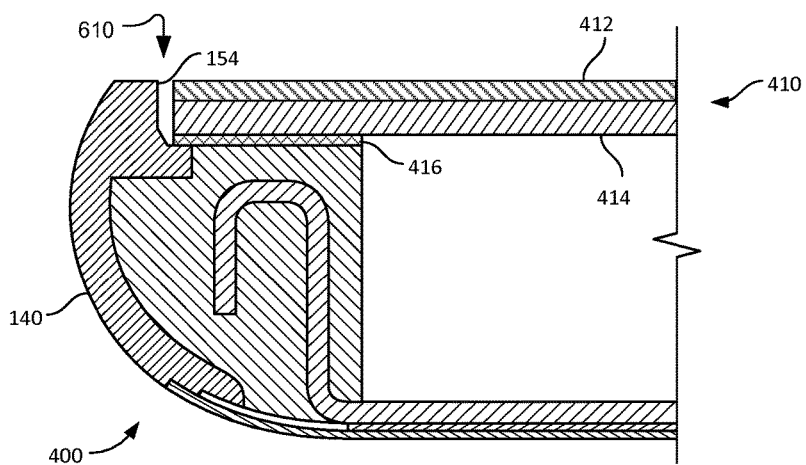
FIG. 6 is a cross-sectional view of a portion of a housing assembly with the display assembly attached.

After all of the internal components of the device 100 are mounted to the rear housing assembly 400, the display assembly 410 is coupled to the rear housing assembly 400 to form a sealed housing. A flex circuit 443 electrically couples the display assembly 410 to the main board 110. FIG. 6 is a cross-sectional view of a portion of a housing assembly 400 with the display assembly 410 attached. Electronic devices with displays may use any of a variety of display modules, such as the touch-sensitive displays utilized in many smartphones and tablet computers. The display module 410 comprises a display panel 414 for producing images (e.g., a LCD panel) coupled to a cover glass portion 412, which forms a protective outer surface of the assembled device 100. The cover glass portion 412 may be made from materials such as glass, fortified glass, reinforced glass, plastic, thermoplastic, and the like, such as, for example, alkali-aluminosilicate glass, commonly used for portable touch-screen computing devices. A gap 610 of, e.g., approximately 0.2 mm, may be provided between the outer edge of the display module 410 and the rim portion 154 of the second mold layer 140 to provide a sufficient amount of tolerances when coupling the display module 410 to the rear housing assembly 400. FIG. 6 shows the display assembly 410 in simplified form, with various components of the display assembly 410 omitted for clarity. The display assembly 410 may be attached to the rear housing assembly 400 with an adhesive layer 416, which adheres the display panel 414 to the ledge portion 152 on the upper side of the rear housing assembly 400.

As described above, after the display assembly 410 is attached to the rear housing assembly 400, the first mold layer 120 is no longer visible. Therefore, it is possible to select a first mold material that provides the desired structural properties (e.g., stiffness, weight, etc.) without regard for the cosmetic appearance of the mold layer. If it is desired to manufacture devices 100 with different color housings, it would only be necessary to provide the second mold layer material in the desired colors. Because the first mold layer 120 is not visible, it can be formed in a single color and then overmolded by the second mold layer 140 in the desired color to devices in different colors. This can help to reduce the number of different materials that will need to be stocked and managed during the manufacturing process. In some embodiments, the first mold material comprises a polycarbonate resin with approximately 40% glass fiber reinforcing agent. This composition provides the first mold layer 120 with high strength, but poor aesthetics, due to the high glass fiber content. The second mold layer 140, which is visible along the sidewall portions of the device 100, may then be selected at least in part to provide a desired aesthetic appearance. The second mold layer 140 may comprise, for example, the same polycarbonate resin, but with a lower glass fiber content. The mold layer 140 may comprise, for example, less than or equal to approximately 9% or 10% glass fibers, or may include no reinforcing agents at all. This second mold layer 140 provides a more aesthetically pleasing appearance, but is softer than the first mold layer 120, so it does not provide the same level of structural support and impact resistance. However, the softness of the second mold layer 140 can help to prevent cracking in the event of a drop or other impact on the device 100.

In accordance with various embodiments of the present invention, the mold layers may be formed using any of a variety of multi-material molding processes, tools, and materials, as would be known by one of ordinary skill in the art. FIGS. 1A-1D illustrate a two-stage insert mold process, in which the metal rear chassis 110 is positioned in a first molding tool, and a first shot of mold material is injected into the first tool to form the first mold layer 120.

Next, the rear chassis 110 with the first mold layer 120 is transferred to a second molding tool. The second molding tool may be configured to apply an adhesive layer 132 to the bottom side of the chassis 110 and the first mold layer 120 so as to adhere the back cover sheet 130 onto the chassis 110 before the second mold layer 140 is formed. The back cover sheet 130 may be used to cover the sheet metal chassis 110 to provide an improved aesthetic appearance of the device 100. The back cover sheet 130 may be made out of any suitable material, such as, for example, a polymer sheet of polycarbonate (PC), poly ethylene terephthalate (PET), or a PC/PET blend. A polymer back cover sheet 130 may be more desirable than depositing an injection molded layer of plastic because an injection molded layer needs to be deposited with a certain minimum thickness in order to ensure an even mold layer across the relatively large, flat surface of the back side of the device 100. This minimum thickness to form an even injection molded layer across the back side may be approximately 0.9-1.0 mm. In contrast, a much thinner sheet of PC or PET may be used instead of a mold layer. The back cover sheet 130 may be, for example, 0.2 mm thick, and the adhesive layer 132 may be 0.1 mm thick, which can result in a reduction in thickness of approximately 0.6-0.7 mm over an injection molded layer and may also reduce the weight of device 100.

The second molding tool may then be used to deposit the second mold layer 140. In the embodiment illustrated in FIG. 1D, the second mold layer 140 is deposited underneath and adjacent to the edge of the back cover sheet 130. As a result, the back cover sheet 130 is adhered to the second mold layer 140 so as to retain the cover sheet 130 in the curved shape shown in FIG. 1D. In addition, the edge of the cover sheet 130 transitions seamlessly to the second mold layer 140 to provide a smooth outer surface without a gap between the edge of the cover sheet 130 and the second mold layer 140, as would be the case if the cover sheet 130 were applied after the second mold 140 was deposited.

The use of multiple mold layers in various embodiments may provide additional advantages. Applying the injection molding in multiple layers can help to prevent sink marks in the mold material. Sink marks in injection molded plastic parts often develop when depositing thick layers of mold material, such that the material in the region of thick features may shrink more than the adjacent mold material, particularly when there is a sudden change in mold material thickness. As can be seen in FIG. 1D, the first mold layer 120 can be formed with a much greater thickness than the second mold layer 140, because any sink marks that might appear in the first mold layer 120 due to the thickness of the layer 120 or sudden transitions in thickness of the layer 120 would be filled in and covered by the second mold layer 140. Therefore, the shape of the first mold layer 120 may be defined without concern about the cosmetic degradation caused by sink marks.

In accordance with some embodiments of the present invention, a housing is formed from multiple injection molded layers having different reinforcing agent content. As a result, the stiffness of various structural members may be tailored by depositing different types of mold materials to different regions. Improving the stiffness in localized areas can aid in optimizing the size and weight of the housing by eliminating the use of high stiffness materials in areas where such stiffness is unnecessary.

Figure 7A:
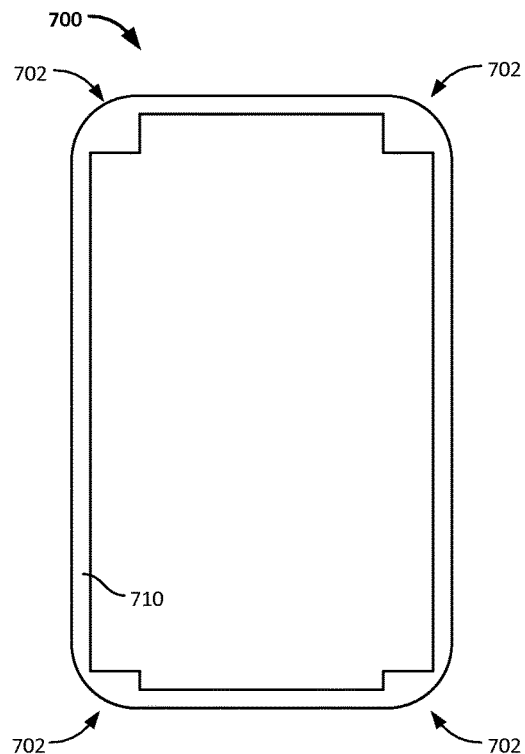
FIGS. 7A-7B are simplified views of a multi-material injection molding process for forming a housing, in accordance with embodiments of the present invention.
Figure 7B:
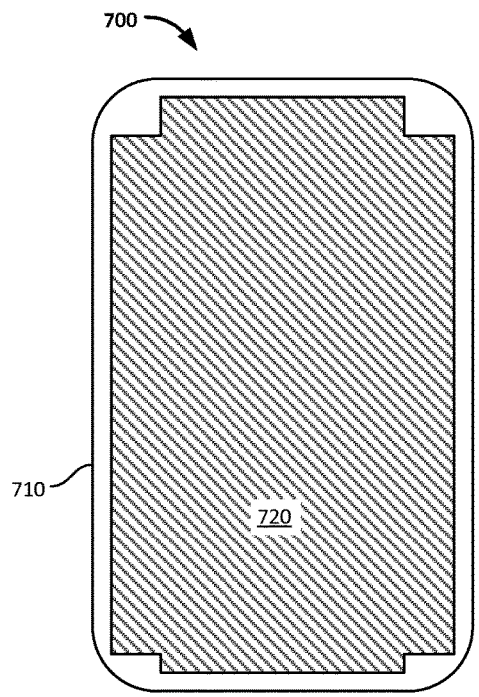

FIGS. 7A-7B are simplified views of a multi-material injection molding process for forming a housing 700, in accordance with embodiments of the present invention. Certain regions of a housing, such as the corners and edges, often require a greater stiffness than other portions, due to the stresses experienced in those regions. A conventional injection molding approach would be to form the housing from a single layer of injection molded material, but with an increased thickness in these regions to provide increased stiffness. However, this can result in an undesirable increase in the size of the device to accommodate these thicker regions.

In the embodiment shown in FIG. 7A, a first injection molded layer 710 is formed in the localized regions where increased stiffness is desired, e.g., along the edges and corners 702. This first mold layer 710 may be formed using a resin, e.g., polycarbonate, polyimide, nylon, or a polycarbonate and acrylonitrile butadiene styrene (ABS) blend, with a reinforcing agent that provides increased stiffness, such as, for example, natural or synthetic fibers, continuous-strand glass fiber filaments, carbon fiber filaments, ceramic fiber filaments, or metal filaments (e.g., aluminum, copper, stainless steel, or tungsten filaments).

Next, a second injection molded layer 720 is formed in the other regions of the housing 700, such as in the large, flat center portion of the housing 700, and/or over the first mold layer 710. This second mold layer 720 may comprise a resin, e.g., polycarbonate, with a different reinforcing agent that provides less stiffness than the reinforcing agent in the first mold layer 710. The second reinforcing agent may comprise, for example, chopped-strand glass fiber filaments, or the second reinforcing agent may be omitted altogether. It may be desirable to utilize the same resin for the first injection molded layer 710 and the second injection molded layer 720 so as to provide a secure bonding between the two layers 710, 720.

As described above, the second mold layer provides a lower level of structural stiffness to the housing assembly, but is more versatile in that it can be formed on more complex geometries than a mold layer with continuous-strand fiber filaments. Therefore, the two mold layers can be selectively deposited to provide high levels of stiffness or high deposition versatility, depending on the desired properties for that localized region of the chassis.

The mold layers 710, 720 may be formed on an underlying metal chassis structure, similar to the rear chassis 110 described above. In other embodiments, the underlying structure can be omitted, and the housing 700 can be formed entirely out of different regions of injection molded material. In some embodiments, the two mold layers may be formed using the same injection molding tool, and in other embodiments, different tools may be used.

Figure 8:
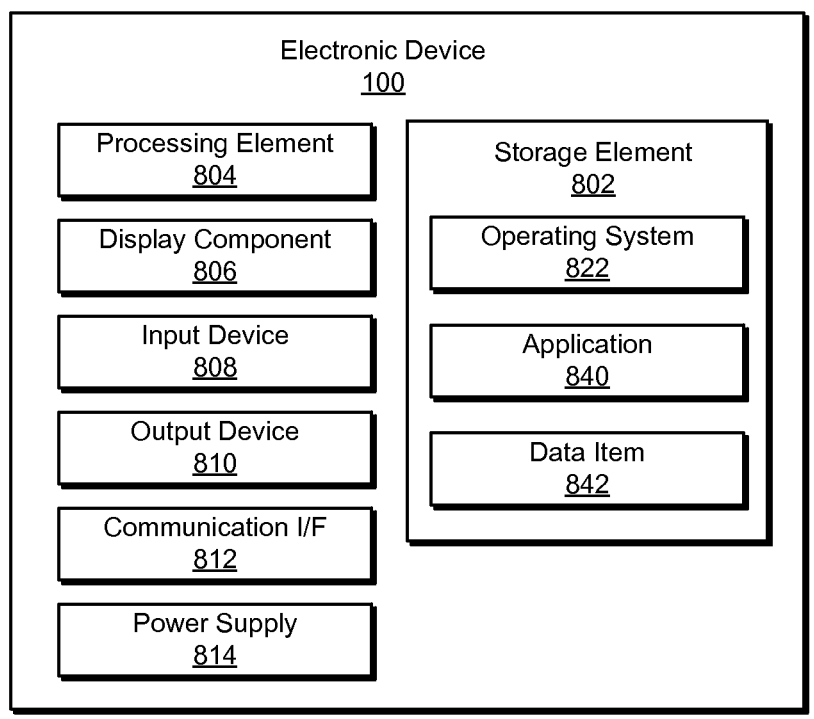
FIG. 8 illustrates an example block diagram of a mobile computing device, in accordance with embodiments of the present invention.

Various embodiments of the present invention may be implemented in any desired device. FIG. 8 illustrates an exemplary block diagram of an electronic device 100 having a housing assembly, formed in accordance with various embodiments of the present invention. The electronic device 100 may be implemented as any of a number of electronic devices, such as an e-book reader, a tablet computing device, a smartphone, a media player, a portable gaming device, a portable digital assistant, a laptop computer, and a desktop computer. It should be understood that various types of computing devices, including a processing element, a memory, and a user interface for receiving user input, can be used in accordance with various embodiments discussed herein.

The electronic device 100 may include a display component 806. The display component 806 may comprise the display assembly 130 and may be a cathode ray tube (CRT), LCD screen, gas plasma-based flat panel display, LCD projector, or other type of display device.

The electronic device 100 may include one or more input devices 808 operable to receive inputs from a user. The input devices 808 can include, for example, a push button, touch pad, touch screen, wheel, joystick, keyboard, mouse, trackball, keypad, accelerometer, light gun, game controller, or any other such device or element with which a user can provide inputs to the electronic device 100. These input devices 808 may be incorporated into the electronic device 100 or operably coupled to the electronic device 100 via wired or wireless interface. For computing devices with touch-sensitive displays, the input devices 808 can include a touch sensor that operates in conjunction with the display component 806 to permit users to interact with the image displayed by the display component 806 using touch inputs (e.g., with a finger or stylus).

The electronic device 100 may also include at least one communication interface 812, comprising one or more wireless components operable to communicate with one or more separate devices within a communication range of the particular wireless protocol. The wireless protocol can be any appropriate protocol used to enable devices to communicate wirelessly, such as Bluetooth, cellular, IEEE 802.11, or infrared communications protocols, such as an IrDA-compliant protocol. It should be understood that the electronic device 100 may also or alternatively include one or more wired communications interfaces for coupling and communicating with other devices.

The electronic device 100 may also include a power supply 814, such as, for example, a rechargeable battery operable to be recharged through conventional plug-in approaches, or through other approaches such as capacitive charging.

The electronic device 100 also includes a processing element 804 for executing instructions and retrieving data stored in a storage element 802. As would be apparent to one of ordinary skill in the art, the storage element 802 can include one or more different types of memory, data storage, or computer-readable storage media, such as, for example, a first data storage for program instructions for execution by the processing element 804, a second data storage for images or data, and/or a removable storage for transferring data to other devices.

The storage element 802 may store software for execution by the processing element 804, such as, for example, operating system software 822 and applications 840. The storage element 802 may also store a data item 842, such as, for example, data files corresponding to one or more applications 840.

Embodiments of the present invention may provide various advantages not provided by prior art systems. The use of multiple mold layers may provide a high level of structural support from the high glass fiber content first mold layer, while still providing a cosmetically desirable exterior from the low glass fiber content second mold layer. In addition, various mold layers utilizing different reinforcing agents may be selectively deposited onto certain regions of a housing in order to provide different material characteristics to different regions.

The mounting of components onto a thin mounting assembly attached to a more rigid chassis can provide advantages over conventional mid-frame designs. The number of housing components may be reduced, thereby reducing the number of manufacturing steps required to complete the assembly.

While the invention has been described in terms of particular embodiments and illustrative figures, those of ordinary skill in the art will recognize that the invention is not limited to the embodiments or figures described. For example, many of the embodiments described above in relate to mold layers comprising a polycarbonate resin with a glass fiber reinforcing agent. However, in other embodiments, any suitable type of base resin and reinforcing agent may be used for the mold layers.

In addition, various embodiments described above utilize two mold layers. However, in other embodiments, three or more layers or regions of injection mold material having different reinforcing agent materials or compositions may be used.

Although the processes, flowcharts, and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer-readable medium for use by or in connection with an instruction execution system, such as a processing component in a computer system. In this sense, the logic may comprise, for example, statements, including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. An electronic device, comprising:
a rear housing assembly, comprising:
a rear chassis comprising metal, the rear chassis including a back plate and four chassis side regions;
a first mold layer injection molded onto the four chassis side regions to form a ledge portion along an upper edge of the rear housing assembly, the first mold layer comprising reinforced polycarbonate with a first percentage of glass fiber content;
a second mold layer injection molded onto the first mold layer to form an exterior sidewall portion on the four chassis side regions, the second mold layer comprising reinforced polycarbonate with a second percentage of glass fiber content, the second percentage being less than the first percentage
a mounting assembly comprising:
a mounting plate member having a first side coupled to an interior side of the back plate of the rear chassis; and
a plurality of screw bosses coupled to a second side of the mounting plate member, the second side being opposite the first side;
a display assembly comprising a cover glass coupled to the ledge portion with a first adhesive layer such that the first mold layer is not exposed on a first exterior surface of the electronic device; and
a printed circuit board positioned between the display assembly and the mounting plate member, the printed circuit board being coupled to the second side of the mounting plate member via the plurality of screw bosses.

2. The electronic device of claim 1, further comprising:
a back cover sheet coupled to an exterior side of the back plate with a second adhesive layer, wherein the second mold layer overlaps a periphery of the back cover sheet.

3. The electronic device of claim 2, wherein:
an edge of a second exterior surface of the second mold layer is flush with a peripheral edge of the back cover sheet.

4. The electronic device of claim 1, wherein:
the rear chassis comprises aluminum;
the mounting plate member comprises stainless steel; and
the plurality of screw bosses comprise stainless steel and are welded to the mounting plate member.

5. An electronic device, comprising:
a rear housing assembly, comprising:
a rear chassis comprising metal, the rear chassis including a back plate and a plurality of chassis side regions;
a first mold layer injection molded onto the plurality of chassis side regions, the first mold layer comprising a first percentage of reinforcing agent content; and
a second mold layer injection molded onto the first mold layer, the second mold layer comprising a second percentage of reinforcing agent content, the second percentage being less than the first percentage;
a front assembly coupled to the rear housing assembly; and
a back cover sheet coupled to an exterior side of the back plate, wherein the second mold layer overlaps an edge of the back cover sheet.

6. The electronic device of claim 5, wherein:
the rear housing assembly further comprises a mounting plate member having a first side coupled to an interior surface of the back plate of the rear chassis and a plurality of screw bosses coupled to a second side of the mounting plate member; and
the electronic device further comprises a printed circuit board positioned between the front assembly and the rear chassis, the printed circuit board being coupled to the second side of the mounting plate member via the plurality of screw bosses.

7. The electronic device of claim 6, wherein:
the rear chassis comprises aluminum;
the mounting plate member comprises stainless steel; and
the plurality of screw bosses comprise stainless steel and are welded to the second side of the mounting plate member.

8. The electronic device of claim 5, wherein:
the first mold layer forms a ledge portion along an upper edge of the rear housing assembly; and
the front assembly is a display assembly comprising a cover glass coupled to the ledge portion with a first adhesive layer.

9. The electronic device of claim 5, wherein:
the back cover sheet comprises a thermoplastic polymer having a thickness of less than about 0.5 mm.

10. The electronic device of claim 5, wherein:
the first mold layer comprises polycarbonate with the first percentage of reinforcing agent content; and
the second mold layer comprises polycarbonate with the second percentage of reinforcing agent content.

11. The electronic device of claim 10, wherein:
the first percentage is at least about 40%; and
the second percentage is less than or equal to about 10%.

12. The electronic device of claim 5, wherein the first mold layer is not exposed on an exterior surface of the electronic device.

13. The electronic device of claim 5, wherein:
the first percentage of reinforcing agent content in the first mold layer comprises the first percentage of a first type of reinforcing agent; and
the second percentage of reinforcing agent content in the second mold layer comprises the second percentage of a second type of reinforcing agent different than the first type of reinforcing agent.

14. The electronic device of claim 13, wherein:
the first mold layer has a greater stiffness than the second mold layer.

15. The electronic device of claim 14, wherein:
the first mold layer is injection molded onto corner regions of the rear chassis.

16. The electronic device of claim 14, wherein:
the first type of reinforcing agent comprises continuous-strand fiber filaments; and
the second type of reinforcing agent comprises chopped-strand fiber filaments.

17. An electronic device, comprising:
a housing assembly, comprising:
a rear chassis comprising metal, the rear chassis including a back plate and a plurality of chassis side regions;
a first mold layer injection molded onto the plurality of chassis side regions;
a second mold layer injection molded onto the first mold layer; and
a back cover directly attached to an exterior side of the back plate with an adhesive layer and coupled to a first portion of the second mold layer, whereby at least a second portion of the back cover is exposed to form an exterior surface of the electronic device.

18. The electronic device of claim 17, wherein the back cover is coupled to the back plate and coupled to the first portion of the second mold layer such that a gap is formed between the back cover and a third portion of the first mold layer.

19. The electronic device of claim 17, wherein the first mold layer forms a ledge portion along an upper edge of the housing assembly effective to support a cover glass.

* * * * *